United States Patent
Braun et al.

(10) Patent No.: US 9,245,647 B2
(45) Date of Patent: Jan. 26, 2016

(54) ONE-TIME PROGRAMMABLE MEMORY CELL AND CIRCUIT

(71) Applicant: Chengdu Monolithic Power Systems Co., Ltd., Chengdu (CN)

(72) Inventors: Eric Braun, Mountain View, CA (US); Da Chen, Sichuan (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 14/320,256

(22) Filed: Jun. 30, 2014

(65) Prior Publication Data

US 2015/0380103 A1 Dec. 31, 2015

(51) Int. Cl.
*G11C 7/00* (2006.01)
*G11C 7/10* (2006.01)
*G11C 17/00* (2006.01)
*G11C 7/06* (2006.01)
*G11C 17/18* (2006.01)
*G11C 17/16* (2006.01)
*G11C 7/08* (2006.01)
*H01L 27/112* (2006.01)
*H01L 27/105* (2006.01)

(52) U.S. Cl.
CPC ............. *G11C 17/18* (2013.01); *G11C 17/16* (2013.01); *G11C 7/065* (2013.01); *G11C 7/08* (2013.01); *H01L 27/105* (2013.01); *H01L 27/112* (2013.01); *H01L 2924/00* (2013.01); *H01L 2924/0002* (2013.01)

(58) Field of Classification Search
CPC .. G11C 7/065; G11C 7/08; H01L 2924/0002; H01L 2924/00; H01L 27/112; H01L 27/105
USPC .......................................... 365/205, 207, 104
See application file for complete search history.

(56) References Cited

U.S. PATENT DOCUMENTS

| | | | | |
|---|---|---|---|---|
| 5,426,614 | A | * | 6/1995 | Harward .................... 365/225.7 |
| 6,351,407 | B1 | * | 2/2002 | Candelier .................... 365/149 |
| 6,876,566 | B2 | * | 4/2005 | Pasolini et al. ................ 365/96 |
| 7,656,738 | B2 | * | 2/2010 | Namekawa ............. 365/230.04 |
| 8,817,563 | B2 | * | 8/2014 | Chung ........................... 365/207 |
| 2009/0109724 | A1 | * | 4/2009 | Buer et al. ...................... 365/96 |
| 2009/0154217 | A1 | * | 6/2009 | Kurjanowicz et al. .......... 365/96 |
| 2009/0201713 | A1 | * | 8/2009 | Shin et al. ....................... 365/96 |
| 2010/0202183 | A1 | * | 8/2010 | Kurjanowicz ................... 365/94 |
| 2013/0265824 | A1 | * | 10/2013 | Tokuda .................... 365/185.05 |

* cited by examiner

*Primary Examiner* — Ly D Pham
(74) *Attorney, Agent, or Firm* — Perkins Coie LLP

(57) ABSTRACT

An OTP memory cell and an OTP memory circuit. The OTP memory cell having a memory module, a write module, a read module, and a load module. Data may be written into the memory module once the write module is active; and data may be read out of the memory module once the read module is active. The OTP memory cell may also have a first latch module and a second latch module.

19 Claims, 6 Drawing Sheets

ONE-TIME PROGRAMMABLE MEMORY CELL AND CIRCUIT

TECHNICAL FIELD

The present invention generally relates to electronic circuit, and more particularly but not exclusively relates to One-Time Programmable (OTP) memory cell and OTP memory circuit.

BACKGROUND

An OTP memory circuit is a non-volatile memory circuit with a simple process and low cost which is widely used in integrated circuit designs. Existing OTP memory circuit may comprise single-ended floating gate OTP memory circuit, fuse OTP memory circuit, and anti-fuse OTP memory circuit etc. A single-ended OTP memory circuit may often comprise a current-sense amplifier which is configured to compare a memory current signal to a reference current signal. Stored information of the OTP memory circuit will be read out according to the comparison result of the current-sense amplifier. In such instance, an additional reference circuit is needed to generate the reference current signal, wherein the reference circuit may mismatch with the memory circuit resulting in instability of the OTP memory circuit.

In a fuse OTP memory circuit, the fuse is blown typically with using an over-current flowing through it, so that a resistance value of the fuse is changed from tens of Ohms to tens of thousands of Ohms or higher for programming. Oppositely, in an anti-fuse OTP memory circuit, a resistance value of the anti-fuse is changed from tens of thousands of Ohms to tens of Ohms for programming. However, a fuse/anti-fuse operated as an OTP storage material is based on its dielectric breakdown characteristics. Resistance of a fuse/anti-fuse during programming is changed, and different fuse/anti-fuse has different resistance, so using a fuse/anti-fuse as a memory has stability problem. Meanwhile, a fuse OTP memory circuit needs a high-pressure storage transistor, thus the cell area of the OTP memory circuit is relatively large. In addition, a high programming voltage may be required in such application which is also a challenge for design and optimization of peripheral circuits.

Accordingly, a Floating gate Avalanche-injection Metal-Oxide Semiconductor (FAMOS) OTP memory circuit with stability, smaller area and less power dissipation is desired.

SUMMARY

In one embodiment, the present invention discloses a One-Time Programmable (OTP) memory cell. The OTP memory cell may be comprise: a memory module having a first terminal and a second terminal, wherein the memory module is configured to store data; a write module having a first input terminal, a second input terminal, a first output terminal and a second output terminal, wherein the write module is configured to write data into the memory module, and wherein the first input terminal of the write module is configured to receive a first write signal, and wherein the second input terminal of the write module is configured to receive a second write signal, and wherein the first output terminal of the write module is configured to provide a first write-in signal to the first terminal of the memory module, and wherein the second output terminal of the write module is configured to provide a second write-in signal to the second terminal of the memory module, and wherein the first write signal and the second write signal are logic complementary, and wherein the first write-in signal and the second write-in signal represent the data needed to store in the memory module, and wherein the first write-in signal and the second write-in signal are logic complementary; a read module having a first input terminal, a second input terminal, a third input terminal, a first output terminal and a second output terminal, wherein the read module is configured to read out data from the memory module, and wherein the first input terminal of the read module is coupled to the first terminal of the memory module, and wherein the second input terminal of the read module is coupled to the second terminal of the memory module, and wherein the third input terminal is configured to receive a read signal, and wherein the first output terminal of the read module is configured to provide a first read-out signal, and wherein the second output terminal of the read module is configured to provide a second read-out signal wherein the read signal is an analog signal, and wherein the first read-out signal and the second read-out signal represent data stored in the memory module, and wherein the first read-out signal and the second read-out signal are logic complementary; a load module having a first input terminal, a second input terminal, a first output terminal and a second output terminal, wherein the first input terminal of the load module is configured to receive a first load signal, and wherein the second input terminal of the load module is configured to receive a second load signal, and wherein the first output terminal of the load module is configured to provide a first load out signal, and wherein the second output terminal of the load module is configured to provide a second load out signal, and wherein the first load signal and the second load signal are logic complementary, and wherein the first load out signal and the second load out signal are logic complementary; a first latch module having a first input terminal, a second input terminal, a first output terminal and a second output terminal, wherein the first input terminal of the first latch module is configured to receive the first read-out signal of the read module and/or the first load out signal of the load module, and wherein the second input terminal of the first latch module is configured to receive the second read-out signal of the read module and/or the second load out signal of the load module, and wherein the first output terminal of the first latch module is coupled to a first output terminal of the OTP memory cell to provide a first output signal of the OTP memory cell, and wherein the second output terminal of the first latch module is coupled to a second output terminal of the OTP memory cell to provide a second output signal of the OTP memory cell, and wherein the first output signal of the OTP memory cell and the second output terminal of the OTP memory cell are logic complementary; and a first multiplexer having a first input terminal, a second input terminal, a third input terminal, a first output terminal and a second output terminal, wherein the first input terminal of the first multiplexer is configured to receive the first output signal of the OTP memory circuit, and wherein the second input terminal of the first multiplexer is configured to receive the second output signal of the OTP memory circuit, and wherein the third input terminal of the first multiplexer is configured to receive a control signal, and wherein the control signal is an analog signal, and wherein the first output terminal of the first multiplexer is configured to provide a first output signal as the first write signal, and wherein the second output terminal of the first multiplexer is configured to provide a second output signal as the second write signal.

In one embodiment, the present invention further discloses an OTP memory cell. The OTP memory cell may comprise: a memory module having a first terminal and a second terminal, wherein the memory module is configured to store data; a write module having a first input terminal, a second input terminal, a first output terminal and a second output terminal, wherein the write module is configured to write data in the memory module, and wherein the first input terminal of the write module is configured to receive a first write signal, and wherein the second input terminal of the write module is configured to receive a second write signal, and wherein the first output terminal of the write module is configured to provide a first write-in signal at the first terminal of the memory module, and wherein the second output terminal of the write module is configured to provide a second write-in signal at the second terminal of the memory module, and wherein the first write signal and the second write signal are logic complementary, and wherein the first write-in signal and the second write-in signal represent the data needed to store in the memory module, and wherein the first write-in signal and the second write-in signal are logic complementary; a read module having a first input terminal, a second input terminal, a third input terminal, a first output terminal and a second output terminal, wherein the read module is configured to read data from the memory module, wherein the first input terminal of the read module is coupled to the first terminal of the memory module, and wherein the second input terminal of the read module is coupled to the second terminal of the memory module, and wherein the third input terminal is configured to receive a read signal, and wherein the first output terminal of the read module is configured to provide a first read-out signal, and wherein the second output terminal of the read module is configured to provide a second read-out signal, and the read signal is an analog signal, and wherein the first read-out signal and the second read-out signal represent data stored in the memory module, and wherein the first read-out signal and the second read-out signal are logic complementary; and wherein the memory module, the write module and the read module have a differential structure.

BRIEF DESCRIPTION OF THE DRAWINGS

Non-limiting and non-exhaustive embodiments are described with reference to the following drawings. The drawings are only for illustration purpose. Usually, the drawings only show part of the system or circuit of the embodiment, and the same reference label in different drawings have the same, similar or corresponding features or functions.

DETAILED DESCRIPTION

While the invention will be described in conjunction with various embodiments, it will be understood that they are not intended to limit the invention to these embodiments. On contrary, the invention is intended to cover alternatives, modifications and equivalents, which may be included within the spirit and scope of the invention as defined by the appended claims. Furthermore, in the following detailed description of the embodiments of the present invention, numerous specific details are set forth in order to provide a thorough understanding of the embodiments of the present invention. However, it will be obvious to one of ordinary skill in the art that without these specific details the embodiments of the present invention may be practiced. In other instance, well-know circuits, materials, and methods have not been described in detail so as not to unnecessarily obscure aspect of the embodiments of the present invention.

Figure 1:
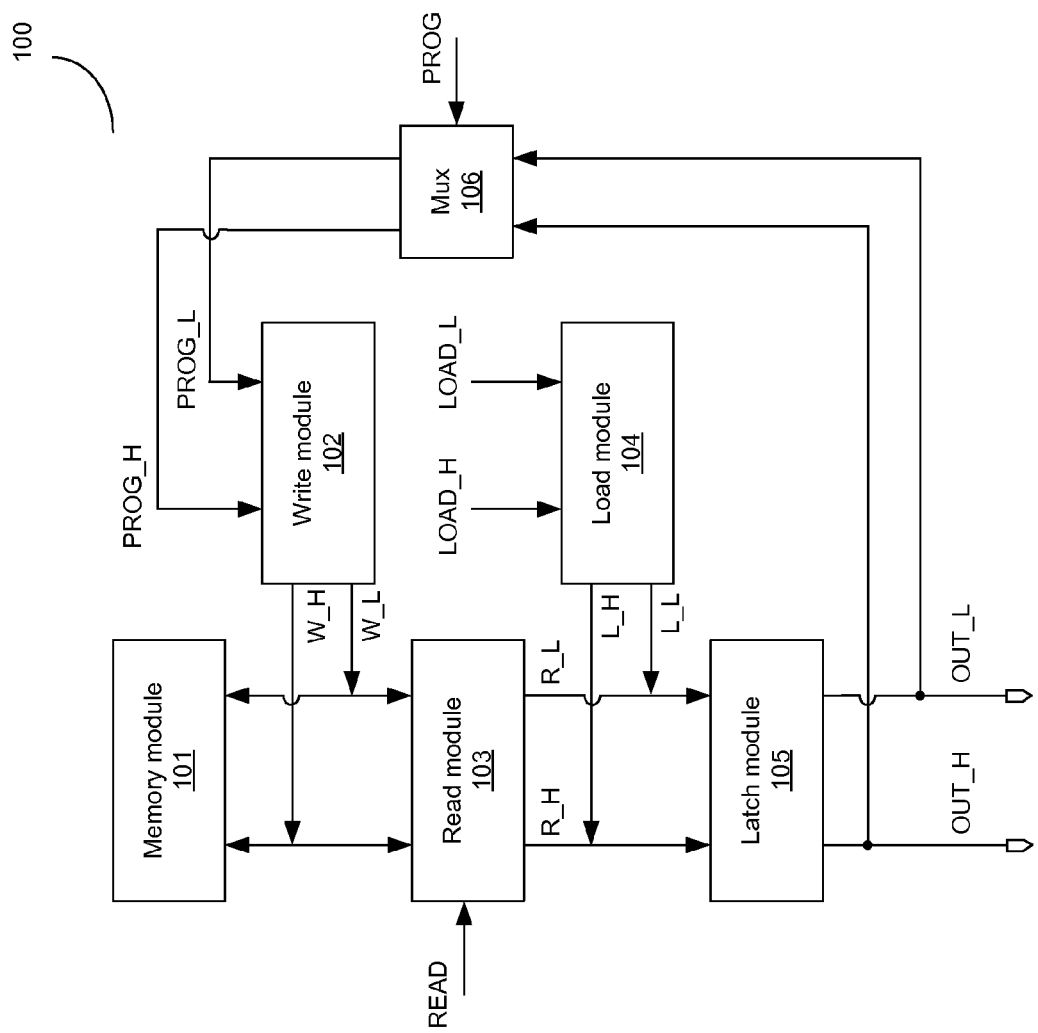
FIG. 1 illustrates a block diagram of an OTP memory cell according to an embodiment of the present invention.

FIG. 1 illustrates a block diagram of one-bit OTP memory cell 100 according to an embodiment of the present invention. In one embodiment, the one-bit OTP memory cell 100 may comprise a one-bit differential FAMOS OTP memory cell.

In FIG. 1, the OTP memory cell 100 may comprise a memory module 101, a write module 102 and a read module 103.

The memory module 101 having a first terminal and a second terminal may be configured to store data. The memory module 101 may be coupled to the write module 102 to receive the output signals of the write module 102 for writing, and may be coupled to the read module 103 to provide input signals of the read module 103 for reading. In one embodiment, the first terminal of the memory module 101 is coupled to the first output terminal of the write module 102 and the first input terminal of the read module 103. The second terminal of the memory module 101 is coupled to the second output terminal of the write module 102 and the second input terminal of the read module 103.

The write module 102 having a first input terminal, a second input terminal, a first output terminal and a second output terminal may be configured to write data in the memory module 101. In one embodiment, the data comprises two logic complementary signals. The first input terminal of the write module 102 may be configured to receive a first write signal PROG_H. The second input terminal of the write module 102 may be configured to receive a second write signal PROG_L. In one embodiment, the first write signal PROG_H and the second write signal PROG_L are logic complementary signals, for example, when the first write signal PROG_H is set logic high, the second write signal PROG_L is set logic low, and vice versa. The first output terminal and the second output terminal of the write module 102 may be coupled to the first terminal and the second terminal of the memory module 101 respectively to provide a first write-in signal W_H and a second write-in signal W_L to the memory module 101. In one embodiment, the first write-in signal W_H and the second write-in signal W_L represent data needed to store in the memory module 101. In one embodiment, the first write-in signal W_H and the second write-in signal W_L are logic complementary signals, for example, when the first write-in signal W_H is set logic high and the second write-in signal W_L is set logic low, and vice versa.

The read module 103 having a first input terminal, a second input terminal, a third input terminal, a first output terminal and a second output terminal may be configured to read data from the memory module 101. The first input terminal and the second input terminal of the read module 103 may be coupled to the first terminal and the second terminal of the memory module 101 respectively to receive the output signals of the memory module 101. The third input terminal of the read module 103 may be configured to receive a read signal READ, wherein the read signal READ may be an analog signal. The first output terminal and the second output terminal of the read module 103 may be configured to provide a first read-out signal R_H and a second read-out signal R_L represented data stored in the memory module 101. In one embodiment, the first read-out signal R_H and the second read-out signal R_L are logic complementary signals, for example, when the first read-out signal R_H is set logic high and the second read-out signal R_L is set logic low, and vice versa.

The memory module 101 may be initially unwritten. During a write operation, data may be written into the memory module 101 by the write module 102 once the first write signal PROG_H and the second write signal PROG_L are active, while the read signal READ is inactive so that the read module 103 is inoperative. During a read operation, the first write signal PROG_H and the second write signal PROG_L are inactive so that the write module 102 is inoperative, while the data written in the memory module 101 will be read out by the read module 103 once the read signal READ is active.

The OTP memory cell 100 may further comprise a load module 104 and a latch module 105.

The load module 104 has a first input terminal, a second input terminal, a first output terminal and a second output terminal. The first input terminal of the load module 104 may be configured to receive a first load signal LOAD_H. The second input terminal of the load module 105 may be configured to receive a second load signal LOAD_L. In one embodiment, the first load signal LOAD_H and the second load signal LOAD_L are logic complementary signals, for example, when the first load signal LOAD_H is set logic high and the second load signal LOAD_L is set logic low, and vice versa. The first output terminal and the second output terminal of the load module 104 may be configured to provide a first load out signal L_H and a second load out signal L_L. In one embodiment, the first load out signal L_H and the second load out signal L_L are logic complementary signals, for example, when the first load out signal L_H is set logic high and the second load out signal L_L is set logic low, and vice versa.

The latch module 105 has a first input terminal, a second input terminal, a first output terminal and a second output terminal. The first input terminal of the latch module 105 may be configured to receive the first read-out signal R_H of the read module 103 and/or the first load out signal L_H of the load module 104. The second input terminal of the latch module 105 may be configured to receive the second read-out signal R_L of the read module 103 and/or the second load out signal L_L of the load module 104. The first output terminal of the latch module 105 may be coupled to a first output terminal of the memory cell 100 to provide a first output signal OUT_H of the OTP memory circuit 100. The second output terminal of the latch module 105 may be coupled to a second output terminal of the OTP memory cell 100 to provide a second output signal OUTL of the OTP memory circuit 100. In one embodiment, the first output signal OUT_H and the second output signal OUTL are logic complementary signals, for example, when the first output signal OUT_H is set logic high, the second output signal OUT_L is set logic low, and vice versa.

In one embodiment, a load operation may be executed before the write operation. The load operation may operate as a "Try before Buy" function. During the load operation, the read signal READ is inactive so that the read module 103 is inoperative. The first load signal LOAD_H and the second load signal LOAD_L of the load module 104 are active so that the load module 104 is operated to provide the first load out signal L_H and the second output signal L_L to the latch module 105. If the first output signal OUT_H and the second output signal OUT_L are correct, i.e. the first output signal OUT_H and the second output signal OUT_L are consistent with desired data stored in the memory module 101, the write operation will be executed next.

The OTP memory cell 100 may further comprise a multiplexer 106 having a first input terminal, a second input terminal, a third input terminal, a first output terminal and a second output terminal. The first input terminal of the multiplexer 106 may be configured to receive the first output signal OUT_H of the OTP memory circuit 100, the second input terminal of the multiplexer 106 may be configured to receive the second output signal OUT_L of the OTP memory circuit 100 and the third input terminal of the multiplexer 106 may be configured to receive a control signal PROG, wherein the control signal PROG may be an analog signal. The multiplexer 106 may be further configured to provide a first output signal as the first write signal PROG_H and a second output signal as the second write signal PROG_L of the write module 102.

The multiplexer 106 may be configured to complete a self-programming of an OTP memory circuit with the load module 104 and the latch module 105. During the self-programming operation, the read signal READ is inactive so that the read module 103 is inoperative. The first load signal LOAD_H and the second load signal LOAD_L of the load module 104 are active so that the load module 104 is operated to provide the first load out signal L_H and the second output signal L_L to the latch module 105. The latch module 105 may be configured to latch the load out signals and provide the first output signal OUT_H and the second output signal OUT_L of the OTP memory cell 100. The first input terminal and the second input terminal of the multiplexer 106 are configured to receive the first output signal OUT_H and the second output signal OUT_L of the OTP memory cell 100 respectively. If the first output signal OUT_H and the second output signal OUT_L are correct, i.e. the first output signal OUT_H and the second output signal OUT_L are consistent with desired data stored in the memory module 101, the control signal PROG may activate the multiplexer 106 to provide the first write signal PROG_H and the second write signal PROG_L for the write module 102.

Furthermore, in one embodiment, a plurality of OTP memory cells are connected each other in an OTP memory circuit. The first output signal OUT_H and the second output signal OUT_L of one OTP memory cell can be operated as the first load signal LOAD_H and the second load signal LOAD_L of another memory cell, so that the self-programming of an OTP memory circuit is achieved.

Figure 2:
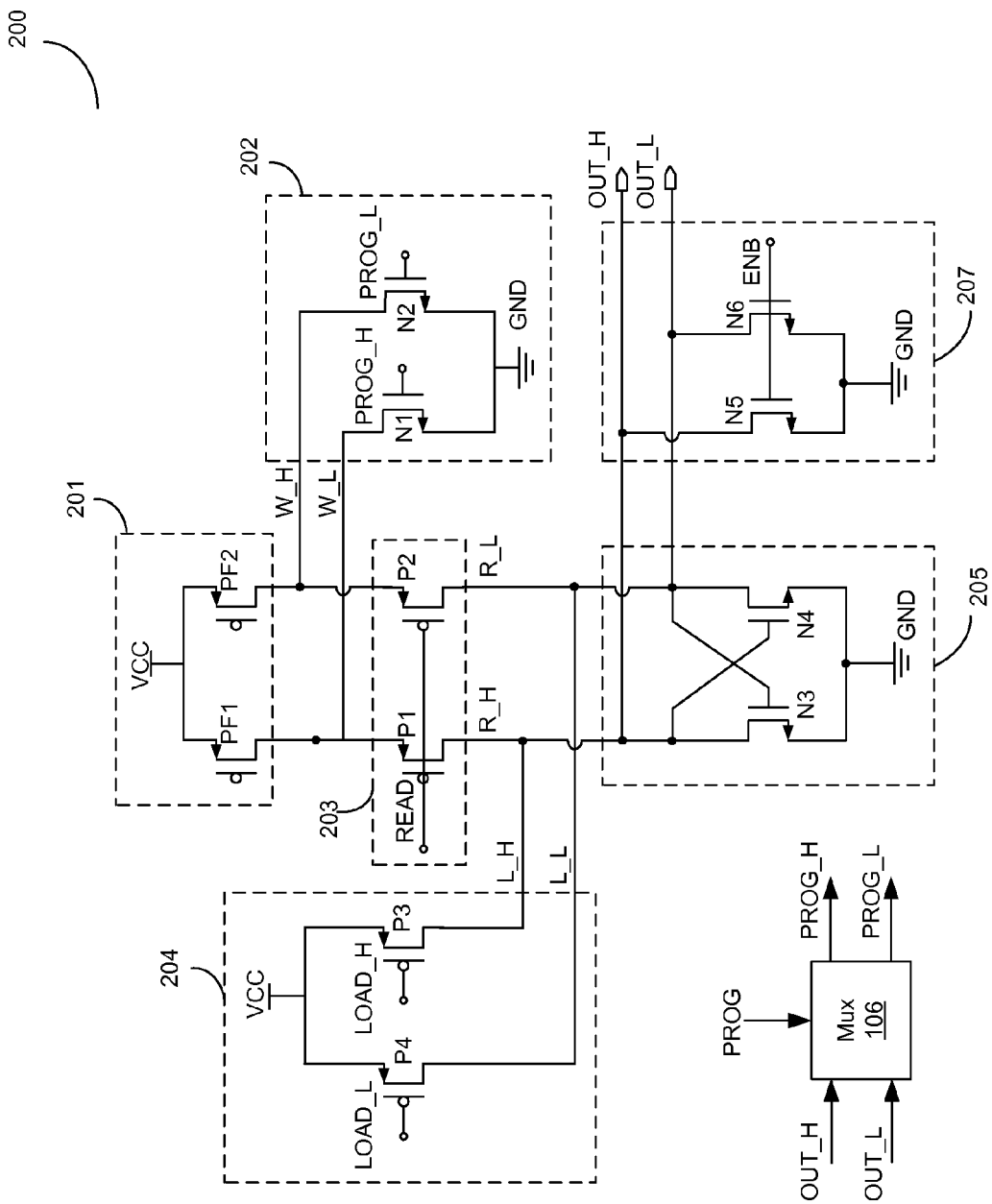
FIG. 2 schematically illustrates an OTP memory cell according to an embodiment of the present invention.

FIG. 2 schematically illustrates an OTP memory cell 200 according to an embodiment of the present invention.

In one embodiment, the memory module 201 may have a differential structure comprising a first FAMOS PF1 and a second FAMOS PF2. The first FAMOS PF1 and the second FAMOS PF2 have a source, a drain and a floating gate respectively. The source of the first FAMOS PF1 and the source of the second FAMOS PF2 may be connected together to receive a supply voltage VCC. The drain of the first FAMOS PF1 may be operated as the first terminal of the memory module 201, and the drain of the second FAMOS PF2 may be operated as the second terminal of the memory module 201.

In one embodiment, the write module 202 may have a differential structure comprising a first N-type Metal-Oxide Semiconductor transistor (NMOS) N1 and a second NMOS N2. The first NMOS N1 and the second NMOS N2 have a source, a drain and a gate respectively. The source of the first NMOS N1 and the source of the second NMOS N2 may be connected together to a logic ground GND. The drain of the first NMOS N1 operated as the first output terminal of the write module 202 may be coupled to the drain of the first FAMOS PF1. The drain of the second NMOS operated as the second output terminal of the write module 202 may be coupled to the drain of the second FAMOS PF2. The gate of the first NMOS N1 operated as the first input terminal of the write module 202 may be configured to receive the first write signal PROG_H. The gate of the second NMOS N2 operated as the second input terminal of the write module 202 may be configured to receive the second write signal PROG_L.

In one embodiment, the read module 203 may have a differential structure comprising a first P-type Metal-Oxide Semiconductor transistor (PMOS) P1 and a second PMOS P2. The first PMOS P1 and the second PMOS P2 have a source, a drain and a gate respectively. The source of the first PMOS P1 operated as the first input terminal of the read module 203 may be coupled to the drain of the first FAMOS PF1. The source of the second PMOS P2 operated as the second input terminal of the read module 203 may be coupled to the drain of the second FAMOS PF2. The gate of the first PMOS P1 and the gate of the second PMOS P2 may be connected together as the third input terminal of the read module 203 to receive the read signal READ, wherein the read signal READ may be an analog signal. The drain of the first PMOS P1 operated as the first output terminal of the read module 203 may be configured to provide the first read-out signal R_H. The drain of the second PMOS P2 operated as the second output terminal of the read module 203 may be configured to provide the second read-out signal R_L.

The first FAMOS PF1 and the second FAMOS PF2 may be initially unwritten. During the write operation, the read signal READ is inactive, i.e. the first PMOS P1 and the second PMOS P2 are both turned off, so that the read module 203 is inoperative, while the first write signal PROG_H and the second write signal PROG_L are active so that the write module 202 is operation so as to write data in the first FAMOS PF1 and the second FAMOS PF2. In one embodiment, the read signal READ is inactive when the values of the read signal READ is equal to the supply voltage VCC. In one embodiment, the first write signal PROG_H and the second write signal PROG_L are active when the first write signal PROG_H is logic high and the second write signal PROG_L is logic low, accordingly, the first NMOS N1 is turned ON so that the first FAMOS PF1 is written with a logic high state, and the second NMOS N2 is turned OFF so that the second FAMOS PF2 is written with a logic low state. In another embodiment, the first write signal PROG_H and the second write signal PROG_L are active when the first write signal PROG_H is logic low and the second write signal PROG_L is logic high, accordingly, the first NMOS N1 is turned OFF so that the first FAMOS PF1 is written with a logic low state, and the second NMOS N2 is turned ON so that the second FAMOS PF2 is written with a logic high state.

During the read operation, the first write signal PROG_H and the second write signal PROG_L are inactive, i.e. the first NMOS N1 and the second NMOS N2 are both turned OFF, so that the write module 202 is inoperative, while the read signal READ is active so that the read module 203 is operational for reading out the data written in the first FAMOS PF1 and the second FAMOS PF2. In one embodiment, the first PMOS P1 and the second PMOS P2 are turned ON once the read signal READ is active.

In one embodiment, the read signal READ is active when the value of the read signal READ is changed from VCC to an analog level below VCC. When the voltage between source and gate of the first PMOS P1 and the second PMOS P2 are larger than a threshold voltage signal $V_{TH}$, the first PMOS P1 and the second PMOS P2 may be turned ON. Thus, the data written in the first FAMOS PF1 and the second FAMOS PF2 will be read out. In one embodiment, the value of the read signal READ is set to VCC-$2V_{TH}$ so that the breakdown voltage between source and drain of a FAMOS is $V_{TH}$ which is the best read voltage for a FAMOS transistor. In such application, the data stored in the first FAMOS PF1 is read out as the first read-out signal R_H and the data stored in the second FAMOS PF2 is read out as the second read-out signal R_L of the read module 203.

After reading out the data from the first FAMOS PF1 and the second FAMOS PF2, the value of the read signal READ is changed back to VCC to keep an inactive state so as to turn off the first PMOS P1 and the second PMOS P2. As shown in FIG. 2, if the first PMOS P1 and the second PMOS P2 are not turned off, the one with a logic low state of the first FAMOS PF1 and the second FAMOS PF2 will be rewritten with a logic high state.

In one embodiment, the load module 204 may have a differential structure comprising a third PMOS P3 and a fourth PMOS P4. The third PMOS P3 and the fourth PMOS P4 have a source, a drain and a gate respectively. The drain of the third PMOS P3 operated as the first output terminal of the load module 204 may be coupled to the drain of the first PMOS P1. The drain of the fourth PMOS P4 operated as the second output terminal of the load module 204 may be coupled to the drain of the second PMOS P2. The source of the third PMOS P3 and the source of the fourth PMOS P4 are connected together to the supply voltage VCC. The gate of the third PMOS P3 operated as the first input terminal of the load module 204 may be configured to receive the first load signal LOAD_H. The gate of the fourth PMOS operated as the second input terminal of the load module 204 may be configured to receive the second load signal LOAD_L.

In one embodiment, the latch module 205 may comprise a third NMOS N3 and a fourth NMOS N4. The third NMOS N3 and the forth NMOS N4 have a source, a drain and a gate respectively. The drain of the third NMOS N3 may be coupled to the gate of the forth NMOS N4 and the drain of the first PMOS P1, and the drain of the forth NMOS N4 may be coupled to the gate of the third NMOS N3 and the drain of the first PMOS P1. The source of the third NMOS N3 and the source of the forth NMOS N4 are connected together to the logic ground GND.

The load operation may be performed before the write operation. The load operation may operate as a "Try before Buy" function. That is to say, before programming the first FAMOS PF1 and the second FAMOS PF2, the data will be loaded into the OTP memory cell 100 firstly. If the data is correct, i.e. the data is consistent with that we expect to store in the memory module 101, the first FAMOS PF1 and the second FAMOS PF2 can be written with those data respectively.

During the load operation, the read signal READ is inactive, i.e. the first PMOS P1 and the second PMOS P2 of the read module 203 are turned off. Meanwhile, the first load signal LOAD_H and the second load signal LOAD_L of the load module 204 are active so that the load module 204 is operated to provide a first load out signal L_H and a second load out signal L_L to the latch module 205. In one embodiment, the first load signal LOAD_H and the second load signal LOAD_L are active when the first load signal LOAD_H is logic high and the second load signal LOAD_L is logic low, accordingly, the third PMOS P3 is turned ON and the forth PMOS P4 is turned OFF. In another embodiment, the first load signal LOAD_H and the second load signal LOAD_L are active when the first load signal LOAD_H is logic low and the second load signal LOAD_L is logic high, accordingly, the third PMOS P3 is turned OFF and the forth PMOS P4 is turned ON.

The latch module 205 may be configured to latch the load out signals to provide the first output signal OUT_H and the second output signal OUT_L. In one embodiment, if the first output signal OUT_H and the second output signal OUT_L are correct, i.e. the first output signal OUT_H and the second output signal OUT_L are consistent with that we expect to store in the memory module 101, the first write signal PROG_H and the second write signal PROG_L are active for operating the write module 202. In another embodiment, if the first output signal OUT_H and the second output signal OUT_L are correct, i.e. the first output signal OUT_H and the second output signal OUT_L are consistent with that we expect to store in the memory module 101, both these two signals are provided to the write module 202 operating as the first write signal PROG_H and the second write signal PROG_L by the multiplexer 106. For example, when the first load signal LOAD_H is set logic high and the second load signal LOAD_L is set logic low, then the first output signal OUT_H is logic high and the second output signal OUT_L is logic low.

Continuing with FIG. 2, the FAMOS OTP memory cell 200 may further comprise an enable module 207 having an input terminal, a first output terminal and a second output terminal. The input terminal of the enable module 207 may be configured to receive an enable signal ENB. The first output terminal of the enable module 207 may be coupled to the first output terminal of the OTP memory cell 200 providing a default value of the first output signal OUT_H. The second output terminal of the enable module 207 may be coupled to the second output terminal of the OTP memory cell 200 providing a default value of the second output signal OUT_L.

In one embodiment, the enable module 207 may have a differential structure comprising a fifth NMOS N5 and a sixth NMOS N6 having a source, a drain and a gate respectively. The drain of the fifth NMOS N5 operated as the first output terminal of the enable module 207 may be coupled to the first output terminal of the OTP memory cell 200. The drain of the sixth NMOS N6 operated as the second output terminal of the enable module 207 may be coupled to the second output terminal of the OTP memory cell 200. The source of the fifth NMOS N5 and the source of the sixth NMOS N6 are coupled together to logic ground GND. The gate of the fifth NMOS N5 and the gate of the sixth NMOS N6 are connected together to operate as the input terminal of the enable module 207 receiving an enable signal ENB.

An enable operation may be performed before any other operations. In one embodiment, the fifth NMOS N5 and the sixth NMOS N6 may be turned ON by asserting a logic high voltage (e.g. VCC) of the enable signal ENB. Accordingly, both the first output signal OUT_H and the second output signal OUT_L of the OTP memory cell 200 may be set to a default logic low state.

In addition, the OTP memory cell 100 further comprises a buffer module (not shown) receiving the first output signal OUT_H and the second output signal OUT_L of the OTP memory cell 200. In one embodiment, the Buffer module may comprise a first inverter and a second inverter.

Figure 3:
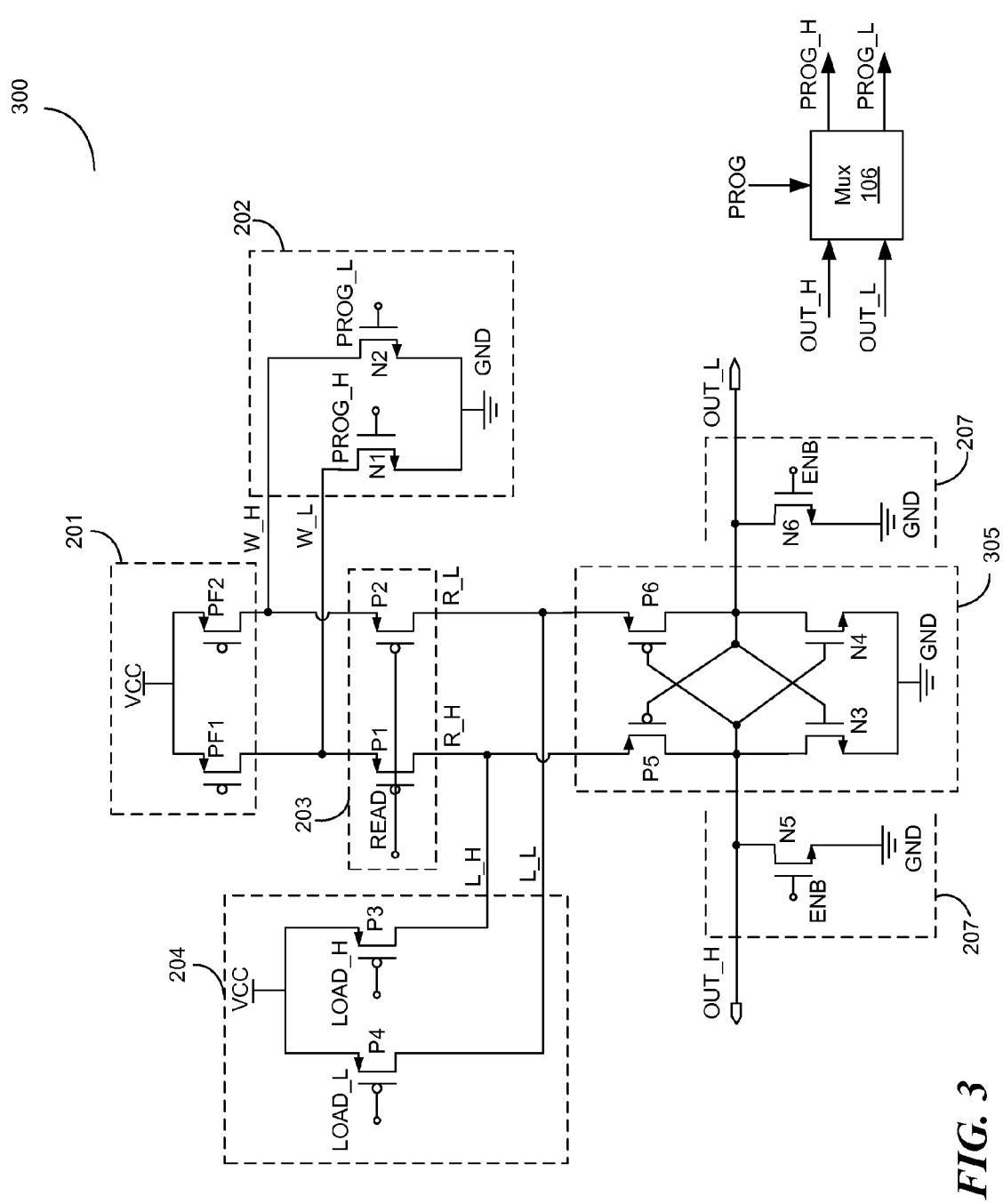
FIG. 3 schematically illustrates an OTP memory cell according to an embodiment of the present invention.

FIG. 3 schematically illustrates an OTP memory cell 300 according to another embodiment of the present invention.

Comparing with the FAMOS OTP memory cell 200, the FAMOS OTP memory cell 300 may comprise a latch module 305 as a replacement for the latch module 205.

In one embodiment, the latch module 305 may comprise a fifth PMOS P5 and a sixth PMOS P6 besides the third NMOSFET N3 and the fourth NMOSFET N4 existing in the latch module 205. The fifth PMOS P5 and the sixth PMOS P6 also have a source, a drain and a gate respectively.

The source of the fifth PMOS P5 operated as the first input terminal of the latch module 305 may be coupled to the first output terminal of the read module 203. The source of the sixth PMOS P6 operated as the second input terminal of the latch module 305 may be coupled to the second output terminal of the read module 203. The drain of the fifth PMOS P5 may be coupled to the drain of the third NMOS N3 to constitute a first common node which is operated as the first output terminal of the latch module 305. The drain of the sixth PMOS P6 may be coupled to the drain of the fourth NMOS N4 to constitute a second common node which is operated as the second output terminal of the latch module 305. The source of the third NMOS N3 and the source of the fourth NMOS N4 are connected together to the logic ground GND. The gate of the fifth PMOS P5 and the gate of the third NMOS N3 are connected together to the second common node of the drain of the sixth PMOS P6 and the drain of the fourth NMOS N4. The gate of the sixth PMOS P6 and the gate of the fourth NMOS N4 are connected together to the first common node of the drain of the fifth PMOS P5 and the drain of the third NMOS N3.

The difference function between the OTP memory cell 200 and the OTP memory cell 300 may focus on the read operation. During a read operation of the OTP memory cell 300, the first write signal PROG_H and the second write signal PROG_L are inactive so as to deactivate the write module 202, i.e. the first NMOS N1 and the second NMOS N2 are both turned OFF. Meanwhile, the read signal READ is active so as to activate the read module 203, accordingly, the first PMOS P1 and the second PMOS P2 are turned ON for reading out the data written in the first FAMOS PF1 and the second FAMOS PF2.

In one embodiment, the read signal READ is active when the values of the read signal READ is changed from VCC to an analog level between VCC and zero. When the voltage between source and gate of the first PMOS P1 and the second PMOS P2 are larger than a threshold voltage signal $V_{TH}$, the first PMOS P1 and the second PMOS P2 may be turned ON. Thus, the data written in the first FAMOS PF1 and the second FAMOS PF2 will be read out. In one embodiment, the value of the read signal READ is set to VCC-$2V_{TH}$ so that the breakdown voltage between source and drain of the FAMOS PF1 (or the FAMOS PF2) is $V_{TH}$ which is the best read voltage for a FAMOS transistor. In such application, the data stored in the first FAMOS PF1 is read out as the first read-out signal R_H and the data stored in the second FAMOS PF2 is read out as the second read-out signal R_L of the read module 203.

After reading out the data from the first FAMOS PF1 and the second FAMOS PF2, the value of the read signal READ is set to zero rather back to the voltage supply VCC so that the first PMOS P1 and the second PMOS P2 maintain their ON state. Accordingly the power consumption of the OTP memory cell 200 is small which further contributes to a small area. Meanwhile, the FAMOS transistor with a logic low state will not be rewritten because of the existing latch module 305.

Figure 4:
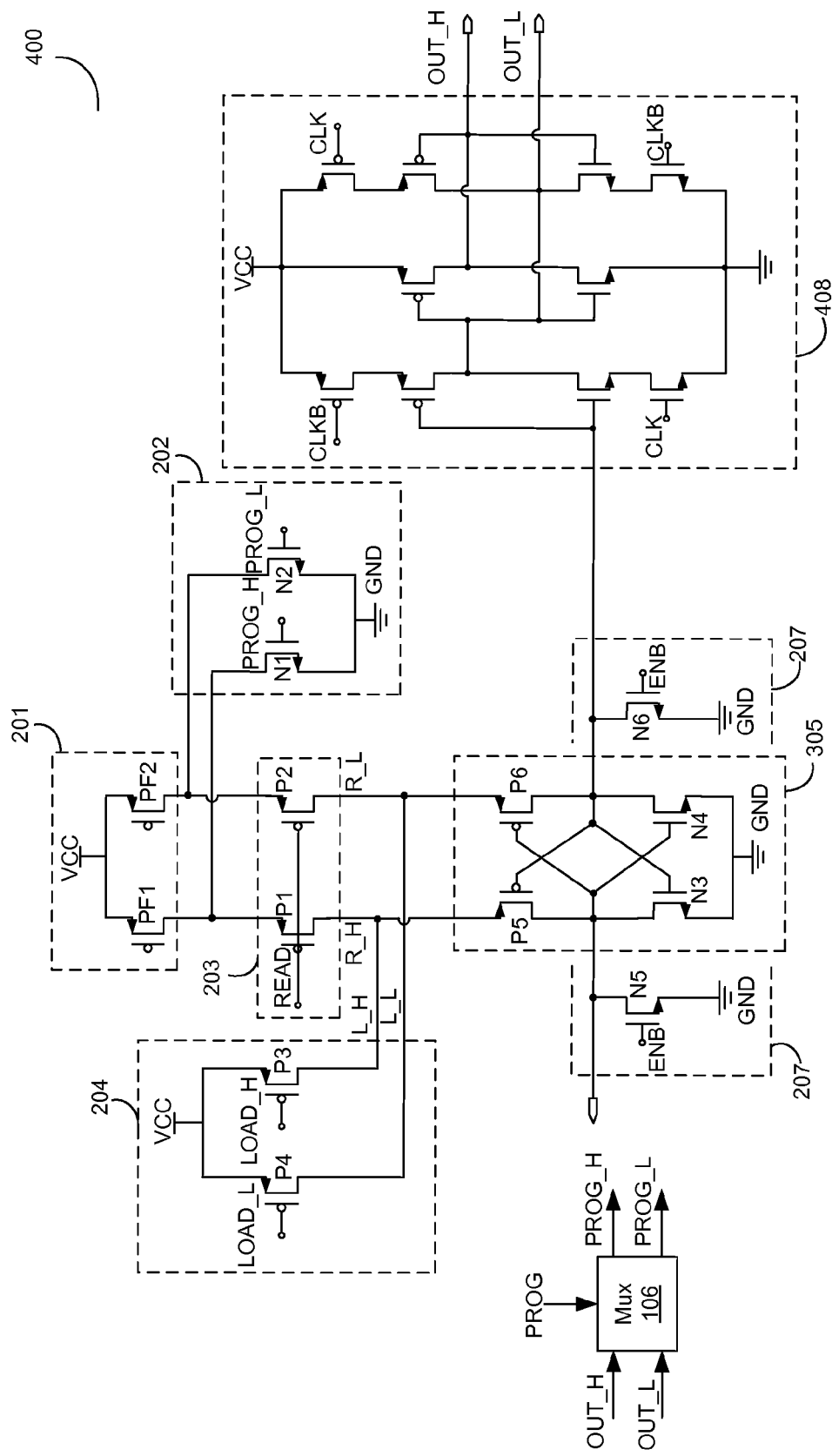
FIG. 4 schematically illustrates an OTP memory cell according to an embodiment of the present invention.

FIG. 4 schematically illustrates an OTP memory cell 400 according to another embodiment of the present invention. Comparing with the OTP memory cell 300, the OTP memory cell 400 may further comprise a second latch module 408. In one embodiment, the second latch module 408 may have an input terminal, a first output terminal and a second output terminal. The input terminal of the second latch module 408 may be coupled to one of the first output terminal and the second output terminal of the latch module 305. The first output terminal of the second latch module 408 operated as the first output terminal of the OTP memory cell 400 may be configured to provide the first output signal OUT_H of the OTP memory cell 400. The second output terminal of the second latch module 408 operated as the second output terminal of the OTP memory cell 400 may be configured to provide the second output signal OUT_L of the OTP memory cell 400. In one embodiment, the second latch module 408 may comprise a Bistable D-type Latch 302 as shown in FIG. 4.

Figure 5:
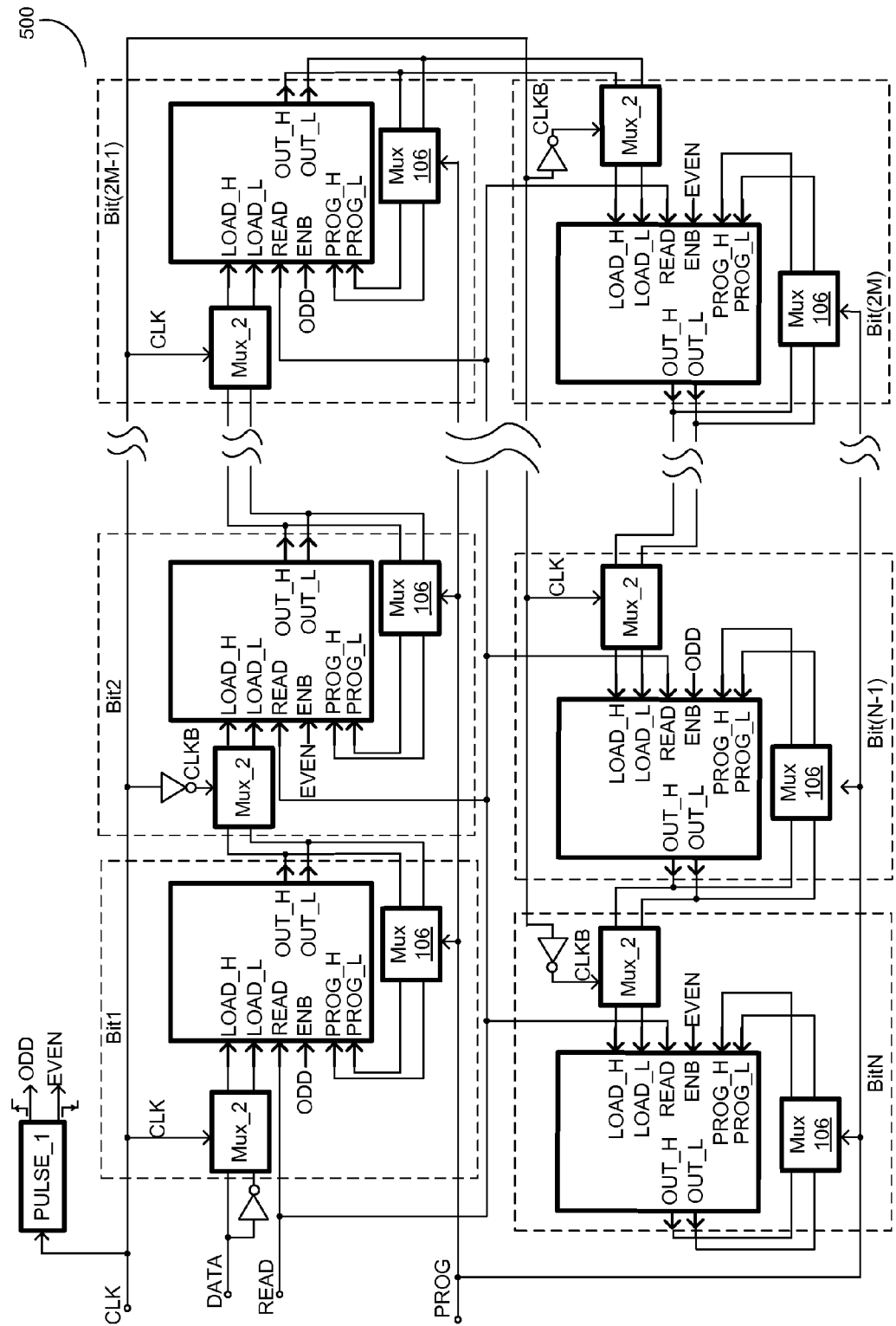
FIG. 5 shows an OTP memory circuit according to an embodiment of the present invention.

FIG. 5 shows an OTP memory circuit 500 according to an embodiment of the present invention. As shown in Figures, the OTP memory circuit 500 comprises a plurality of OTP memory cells, e.g. Bit 1, Bit 2, . . . , Bit (N-1), Bit N, connected in series, wherein N is a positive integer and is only used to label and differentiate the plurality of OTP memory cells from each other. In an embodiment, an odd integer represents an odd OTP memory cell and an even integer represents an even OTP memory cell, e.g., Bit 1 (or Bit 3, . . . , Bit (2M-1)) indicates an even OTP memory cell and Bit 2 (or Bit 4, . . . , Bit (2M)) indicates an even OTP memory cell, wherein M is a natural number and 2M≤N. Therefore, it can be understood that the plurality of OTP memory cells in FIG. 5 can be referred to as comprising a first plurality of odd memory cells (Bit 1, Bit 3, . . . , Bit (2M-1)) and a second plurality of even memory cells (Bit 2, Bit 4, . . . , Bit (2M)). However, one of ordinary skill in the art should note that this is just for purpose of providing examples but not intended to be limiting.

In accordance with an embodiment of the present invention, each of the OTP memory cells Bit 1, Bit 2, . . . , Bit (N-1), Bit N comprises an OTP memory cell 300. The OTP memory cell 300 comprises a memory module 201, a write module 202, a read module 203, a load module 204, a latch module 305, a multiplexer 106 and an enable module 207. In addition, each of the OTP memory cells, e.g. Bit 1, Bit 2, . . . , Bit (N-1), Bit N, further comprises a second multiplexer Mux_2.

The second multiplexer Mux_2 have a first input terminal, a second input terminal, a first output terminal, a second output terminal and a control terminal. The first input terminal of the second multiplexer Mux_2 may be configured to receive a first data signal, and the second input terminal of the second multiplexer Mux_2 may be configured to receive a second data signal which is complementary to the first data signal. The first output terminal and the second output terminal of the second multiplexer Mux_2 may be configured to provide a first load signal LOAD_H and a second load signal LOAD_L respectively. The control terminal of the second multiplexer Mux_2 may be configured to receive a clock signal. In one embodiment, the clock signal in the OTP memory circuit 500 may comprise an odd clock signal CLK and an even clock signal CLKB.

The control terminal of the second multiplexer Mux_2 of an odd OTP memory cell, e.g. Bit 1, Bit 3, . . . , Bit(2M-1), may be configured to receive an odd clock signal CLK. The control terminal of the second multiplexer Mux_2 of an even OTP memory cell, e.g. Bit 2, Bit 4, . . . , Bit(2M), may be configured to receive an even clock signal CLKB. In one embodiment, the odd clock signal CLK and the even clock signal CLKB are complementary.

In FIG. 5, as shown in the first OTP memory cell Bit1 of the OTP memory circuit 500, the first input terminal of the second multiplexer Mux_2 may be configured to receive a first data signal DATA, and the second input terminal of the second multiplexer Mux_2 may be configured to receive a second data signal which is complementary to the first data signal DATA. In one embodiment, the second data signal may be obtained by inverting the first data signal through an inverter. For the rest of OTP memory cell, e.g. Bit 2, Bit 3, . . . , Bit (N-1), Bit N, the first input terminal of the second multiplexer Mux_2 of the OTP memory cell Bit 2 may be configured to receive a first output signal OUT_H of the OTP memory cell Bit 1. The second input terminal of the second multiplexer Mux_2 of the memory cell Bit 2 may be configured to receive a second output signal OUT_L of the OTP memory cell Bit 1, and so forth.

In addition, the OTP memory circuit 500 further comprises a pulse generator PULSE_1 which is configured to generate two complementary enable signals. The pulse generator PULSE_1 has an input terminal, a first output terminal and a second output terminal. In one embodiment, the input terminal of the pulse generator PULSE_1 is configured to receive the clock signal CLK, the first output terminal of the pulse generator PULSE_1 is configured to provide a odd enable signal ODD, and the second output terminal of the pulse generator PULSE_1 is configured to provide a even enable signal EVEN. In one embodiment, the odd enable signal ODD is the rising edge of a clock signal CLK and the even enable signal EVEN is the falling edge of the clock signal CLK.

In one embodiment, the input terminal of the enable module of an odd OTP memory cell, e.g. Bit 1, Bit 3, . . . , Bit(2M-1), may be configured to receive an odd enable signal ODD. The input terminal of the enable module of an even OTP memory cell, e.g. Bit 2, Bit 4, . . . , Bit(2M), may be configured to receive an enable signal EVEN. In one embodiment, the odd clock signal CLK and the even clock signal CLKB are complementary.

Figure 6:
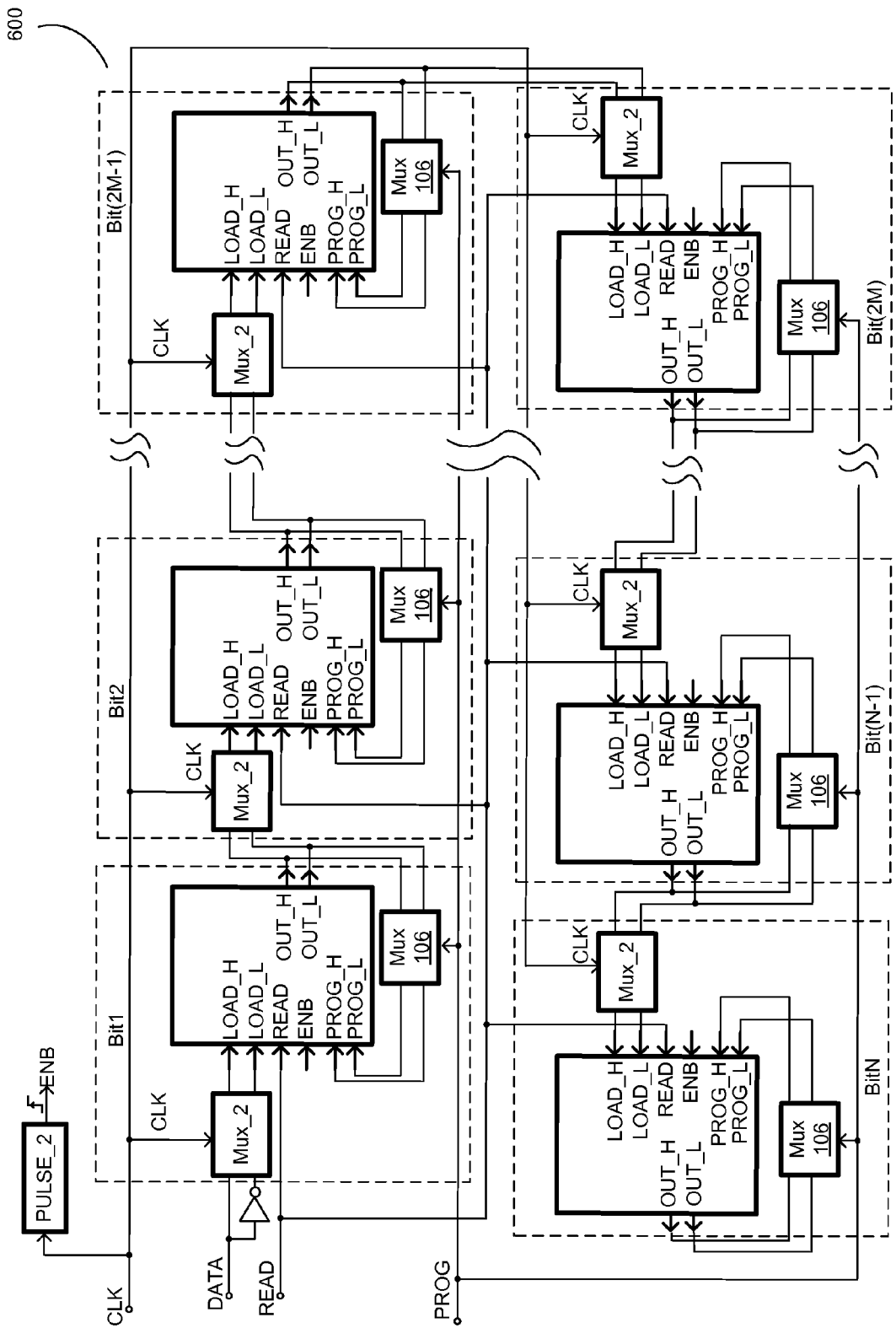
FIG. 6 shows an OTP memory circuit according to an embodiment of the present invention.

FIG. 6 shows an OTP memory circuit 600 according to an embodiment of the present invention. As shown in FIG. 6, the OTP memory circuit 600 comprises a plurality of OTP memory cells, e.g. Bit 1, Bit 2, . . . , Bit (N-1), Bit N, connected in series, wherein N is a positive integer and is only used to label and differentiate the plurality of OTP memory cells from each other. In an embodiment, an odd integer symbol represents an odd OTP memory cell and an even integer symbol represents an even OTP memory cell, e.g., Bit 1 (or Bit 3, . . . , Bit (2M-1)) indicates an even OTP memory cell and Bit 2 (or Bit 4, . . . , Bit (2M)) indicates an even OTP memory cell, wherein M is a natural number and 2M≤N. Therefore, it can be understood that the plurality of OTP memory cells in FIG. 5 can be referred to as comprising a first plurality of odd memory cells (Bit 1, Bit 3, . . . , Bit (2M-1)) and a second plurality of even memory cells (Bit 2, Bit 4, . . . , Bit (2M)). However, one of ordinary skill in the art should note that this is just for purpose of providing examples but not intended to be limiting.

In accordance with an embodiment of the present invention, each of the OTP memory cells Bit 1, Bit 2, . . . , Bit (N-1), Bit N comprises an OTP memory cell 400. The OTP memory cell 400 comprises a memory module 201, a write module 202, a read module 203, a load module 204, a latch module 305, a multiplexer 106, a second latch module 408 and an enable module 207. In addition, each of the OTP memory cells, e.g. Bit 1, Bit 2, . . . , Bit (N-1), Bit N, further comprises a second multiplexer Mux_2.

The second multiplexer Mux_2 has a first input terminal, a second input terminal, a first output terminal, a second output terminal and a control terminal. The first input terminal of the second multiplexer Mux_2 may be configured to receive a first data signal, and the second input terminal of the second multiplexer Mux_2 may be configured to receive a second data signal which is complementary to the first data signal. The first output terminal and the second output terminal of the second multiplexer Mux_2 may be configured to provide a first load signal LOAD_H and a second load signal LOAD_L respectively. The control terminal of the second multiplexer Mux_2 may be configured to receive the clock signal CLK to control the second multiplexer Mux_2.

In FIG. 6, as shown in the first OTP memory cell Bit1 of the OTP memory circuit 600, the first input terminal of the second multiplexer Mux_2 may be configured to receive a first data signal DATA, and the second input terminal of the second multiplexer Mux_2 may be configured to receive a second data signal which is complementary to the first data signal DATA. In one embodiment, the second data signal may be obtained by inverting the first data signal DATA through an inverter. For the rest of OTP memory cell, e.g. Bit 2, Bit 3, . . . , Bit (N−1), Bit N, the first input terminal of the second multiplexer Mux_2 of the OTP memory cell Bit 2 may be configured to receive a first output signal OUT_H of the OTP memory cell Bit 1. The second input terminal of the second multiplexer Mux_2 of the memory cell Bit 2 may be configured to receive a second output signal OUT_L of the OTP memory cell Bit 1, and so forth.

The OTP memory circuit 600 further comprises a pulse generator PULSE_2 which is configured to generate an enable signal. In one embodiment, the pulse generator PULSE_2 has an input terminal receiving the clock signal CLK, and an output terminal providing the enable signal ENB. In one embodiment, the enable signal ENB is the rising edge of the clock signal CLK.

It should be noted that the ordinary skill in the art should know that the start-up method presented in this invention not only limited in this voltage divider topology, but also in other large current applications needed charge-pump. Similarly, the sensing circuit, controller etc. presented in this invention only used to schematically show a method as an example.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A One-Time Programmable (OTP) memory cell, comprising:
    a memory module having a first terminal and a second terminal, wherein the memory module is configured to store data;
    a write module having a first input terminal, a second input terminal, a first output terminal and a second output terminal, wherein the write module is configured to write data into the memory module, and wherein the first input terminal of the write module is configured to receive a first write signal, and wherein the second input terminal of the write module is configured to receive a second write signal, and wherein the first output terminal of the write module is configured to provide a first write-in signal to the first terminal of the memory module, and wherein the second output terminal of the write module is configured to provide a second write-in signal to the second terminal of the memory module, and wherein the first write signal and the second write signal are logic complementary, and wherein the first write-in signal and the second write-in signal represent the data needed to store in the memory module, and wherein the first write-in signal and the second write-in signal are logic complementary;
    a read module having a first input terminal, a second input terminal, a third input terminal, a first output terminal and a second output terminal, wherein the read module is configured to read out data from the memory module, and wherein the first input terminal of the read module is coupled to the first terminal of the memory module, and wherein the second input terminal of the read module is coupled to the second terminal of the memory module, and wherein the third input terminal is configured to receive a read signal, and wherein the first output terminal of the read module is configured to provide a first read-out signal, and wherein the second output terminal of the read module is configured to provide a second read-out signal wherein the read signal is an analog signal, and wherein the first read-out signal and the second read-out signal represent data stored in the memory module, and wherein the first read-out signal and the second read-out signal are logic complementary;
    a load module having a first input terminal, a second input terminal, a first output terminal and a second output terminal, wherein the first input terminal of the load module is configured to receive a first load signal, and wherein the second input terminal of the load module is configured to receive a second load signal, and wherein the first output terminal of the load module is configured to provide a first load out signal, and wherein the second output terminal of the load module is configured to provide a second load out signal, and wherein the first load signal and the second load signal are logic complementary, and wherein the first load out signal and the second load out signal are logic complementary;
    a first latch module having a first input terminal, a second input terminal, a first output terminal and a second output terminal, wherein the first input terminal of the first latch module is configured to receive the first read-out signal of the read module and/or the first load out signal of the load module, and wherein the second input terminal of the first latch module is configured to receive the second read-out signal of the read module and/or the second load out signal of the load module, and wherein the first output terminal of the first latch module is coupled to a first output terminal of the OTP memory cell to provide a first output signal of the OTP memory cell, and wherein the second output terminal of the first latch module is coupled to a second output terminal of the OTP memory cell to provide a second output signal of the OTP memory cell, and wherein the first output signal of the OTP memory cell and the second output terminal of the OTP memory cell are logic complementary; and
    a first multiplexer having a first input terminal, a second input terminal, a third input terminal, a first output terminal and a second output terminal, wherein the first input terminal of the first multiplexer is configured to receive the first output signal of the OTP memory circuit, and wherein the second input terminal of the first multiplexer is configured to receive the second output signal of the OTP memory circuit, and wherein the third input terminal of the first multiplexer is configured to receive a control signal, and wherein the control signal is an analog signal, and wherein the first output terminal of the first multiplexer is configured to provide a first output signal as the first write signal, and wherein the second output terminal of the first multiplexer is configured to provide a second output signal as the second write signal.

2. The OTP memory cell of claim 1, wherein the memory module has a differential structure comprising a first Floating Gate Metal-Oxide Semiconductor transistor (FAMOS) and a second FAMOS, wherein the first FAMOS and the second FAMOS have a source, a drain and a floating gate respectively, and wherein the source of the first FAMOS and the source of the second FAMOS are connected together to receive a supply voltage; and wherein the drain of the first FAMOS is configured to operate as the first terminal of the memory module; and wherein the drain of the second FAMOS is configured to operate as the second terminal of the memory module.

3. The OTP memory cell of claim 1, wherein the write module has a differential structure comprising a first N-type Metal-Oxide Semiconductor transistor (NMOS) and a second NMOS, wherein the first NMOS and the second NMOS have a source, a drain and a gate respectively, and wherein the source of the first NMOS and the source of the second NMOS are connected to a logic ground; and wherein the drain of the first NMOS is configured to operate as the first output terminal of the write module, and is coupled to the first terminal of the memory module; and wherein the drain of the second NMOS is configured to operate as the second output terminal of the write module, and is coupled to the second terminal of the memory module; and wherein the gate of the first NMOS is configured to operate as the first input terminal of the write module, and is configured to receive the first write signal; and wherein the gate of the second NMOS is configured to operate as the second input terminal of the write module, and is configured to receive the second write signal.

4. The OTP memory cell of claim 1, wherein the read module has a differential structure comprising a first P-type Metal-Oxide Semiconductor transistor (PMOS) and a second PMOS, wherein the first PMOS and the second PMOS have a source, a drain and a gate respectively, and wherein the source of the first PMOS is configured to operate as the first input terminal of the read module, and is coupled to the first terminal of the memory module; and wherein the source of the second PMOS is configured to operate as the second input terminal of the read module, and is coupled to the second terminal of the memory module; and wherein the gate of the first PMOS and the gate of the second PMOS is connected together as the third input terminal of the read module to receive the read signal; and wherein the drain of the first PMOS is configured to operate as the first output terminal of the read module, and is configured to provide the first read-out signal; and wherein the drain of the second PMOS is configured to operate as the second output terminal of the read module, and is configured to provide the second read-out signal.

5. The OTP memory cell of claim 1, wherein the load module has a differential structure comprising a third PMOS and a fourth PMOS, wherein the third PMOS and the fourth PMOS have a source, a drain and a gate respectively, and wherein the drain of the third PMOS is configured to operate as the first output terminal of the load module, and is coupled to the first output terminal of the read module; and wherein the drain of the fourth PMOS is configured to operate as the second output terminal of the load module, and is coupled to the second output terminal of the read module; and wherein the source of the third PMOS and the source of the fourth PMOS are connected together to the supply voltage; and wherein the gate of the third PMOS is configured to operate as the first input terminal of the load module, and is configured to receive the first load signal; and wherein the gate of the fourth PMOS is configured to operate as the second input terminal of the load module, and is configured to receive the second load signal.

6. The OTP memory cell of claim 1, wherein the first latch module comprises a third NMOS and a fourth NMOS, wherein the third NMOS and the forth NMOS have a source, a drain and a gate respectively, and wherein the drain of the third NMOS is coupled to the gate of the forth NMOS and the first output terminal of the read module; and wherein the drain of the forth NMOS is coupled to the gate of the third NMOS and the second output terminal of the read module; and wherein the source of the third NMOS and the source of the forth NMOS are connected together to the logic ground.

7. The OTP memory cell of claim 1, wherein the first latch module comprises a fifth PMOS, a sixth PMOS, a third NMOS and a fourth NMOS, wherein the fifth PMOS, the sixth PMOS, the third NMOS and the fourth NMOS have a source, a drain and a gate respectively, and wherein the source of the fifth PMOS is configured to operate as the first input terminal of the first latch module, and is coupled to the first output terminal of the read module; and wherein the source of the sixth PMOS is configured to operate as the second input terminal of the first latch module, and is coupled to the second output terminal of the read module; and wherein the drain of the fifth PMOS is coupled to the drain of the third NMOS to constitute a first common node, the first common node is configured to operate as the first output terminal of the first latch module; and wherein the drain of the sixth PMOS is coupled to the drain of the fourth NMOS to constitute a second common node, the second common node is configured to operate as the second output terminal of the first latch module; and wherein the source of the third NMOS and the source of the fourth NMOS are connected together to the logic ground; and wherein the gate of the fifth PMOS and the gate of the third NMOS are connected together to the second common node of the drain of the sixth PMOS and the drain of the fourth NMOS; and wherein the gate of the sixth PMOS and the gate of the fourth NMOS are connected together to the first common node of the drain of the fifth PMOS and the drain of the third NMOS.

8. The OTP memory cell of claim 1, wherein the OTP memory cell further comprises an enable module having an input terminal, a first output terminal and a second output terminal, and wherein the enable module is configured to provide a default value of the first output signal of the OTP memory cell and a default value of the second output signal of the OTP memory cell; the input terminal of the enable module is configured to receive an enable signal; and wherein the first output terminal of the enable module is coupled to the first output terminal of the OTP memory cell; and wherein the second output terminal of the enable module is coupled to the second output terminal of the OTP memory cell.

9. The OTP memory cell of claim 8, wherein the enable module has a differential structure comprising a fifth NMOS and a sixth NMOS having a source, a drain and a gate respectively, and wherein the drain of the fifth NMOS N5 is configured to operate as the first output terminal of the enable module is coupled to the first output terminal of the OTP memory cell; and wherein the drain of the sixth NMOS is configured to operate as the second output terminal of the enable module is coupled to the second output terminal of the OTP memory cell; and wherein the source of the fifth NMOS and the source of the sixth NMOS are coupled together to the logic ground; and wherein the gate of the fifth NMOS and the gate of the sixth NMOS are connected together to configure to operate as the input terminal of the enable module, and is configured to receive an enable signal.

10. The OTP memory cell of claim 1, wherein the OTP memory cell further comprises a second latch module having an input terminal, a first output terminal and a second output terminal, and wherein the input terminal of the second latch module is coupled to one of the first output terminal and the second output terminal of the first latch module; and wherein the first output terminal of the second latch module is configured to operate as the first output terminal of the OTP memory cell is configured to provide the first output signal; and wherein the second output terminal of the second latch module is configured to operate as the second output terminal of the OTP memory cell, and is configured to provide the second output signal.

11. The OTP memory cell of claim 10, wherein the second latch module comprises a Bistable D-type Latch.

12. An OTP memory circuit comprising a plurality of OTP memory cells of claim 8, wherein:
the plurality of OTP memory cells are connected in series; and wherein
each of the OTP memory cell further comprises a second multiplexer having a first input terminal, a second input terminal, a first output terminal, a second output terminal and a control terminal, wherein the first input terminal of the second multiplexer is configured to receive a first data signal, and wherein the second input terminal of the second multiplexer is configured to receive a second data signal, the second data signal is complementary to the first data signal, and wherein the first output terminal and the second output terminal of the second multiplexer are configured to provide the first load signal and the second load signal respectively, and wherein the control terminal of the second multiplexer is configured to receive a clock signal.

13. The OTP memory circuit of claim 12, wherein:
each of the plurality of OTP memory cells is labeled with a distinct integer, the plurality of OTP memory cells comprise a plurality of odd OTP memory cells labeled with odd integers and a plurality of even OTP memory cells labeled with even integers; and wherein
the clock signal comprises a first clock signal and a second clock signal, and wherein the second clock signal is complementary to the first clock signal; and wherein
the control terminal of the second multiplexer of an odd OTP memory cell is configured to receive the first clock signal, and wherein the control terminal of the second multiplexer of an even OTP memory cell is configured to receive the second clock signal.

14. The OTP memory circuit of claim 13, wherein the OTP memory circuit further comprises a first pulse generator having an input terminal, a first output terminal and a second output terminal; and wherein the input terminal of the first pulse generator is configured to receive the first clock signal; and wherein the first output terminal of the first pulse generator is configured to provide a first enable signal at the input terminal of the enable module of an odd OTP memory cell; and wherein the second output terminal of the first pulse generator is configured to provide a second enable signal at the input terminal of the enable module of an even OTP memory cell.

15. The OTP memory circuit of claim 12, wherein the OTP memory circuit further comprises a second latch module having an input terminal, a first output terminal and a second output terminal, and wherein the input terminal of the second latch module is coupled to one of the first output terminal and the second output terminal of the first latch module; and wherein the first output terminal of the second latch module is configured to operate as the first output terminal of the OTP memory cell, and is configured to provide the first output signal; and wherein the second output terminal of the second latch module is configured to operate as the second output terminal of the OTP memory cell, and is configured to provide the second output signal.

16. The OTP memory circuit of claim 15, wherein the OTP memory circuit further comprises a second pulse generator having an input terminal and an output terminal, and wherein the input terminal of the second pulse generator is configured to receive the clock signal, and wherein the output terminal of the second pulse generator is configured to provide the enable signal.

17. A One-Time Programmable (OTP) memory cell, comprising:
a memory module having a first terminal and a second terminal, wherein the memory module is configured to store data;
a write module having a first input terminal, a second input terminal, a first output terminal and a second output terminal, wherein the write module is configured to write data in the memory module, and wherein the first input terminal of the write module is configured to receive a first write signal, and wherein the second input terminal of the write module is configured to receive a second write signal, and wherein the first output terminal of the write module is configured to provide a first write-in signal at the first terminal of the memory module, and wherein the second output terminal of the write module is configured to provide a second write-in signal at the second terminal of the memory module, and wherein the first write signal and the second write signal are logic complementary, and wherein the first write-in signal and the second write-in signal represent the data needed to store in the memory module, and wherein the first write-in signal and the second write-in signal are logic complementary;
a read module having a first input terminal, a second input terminal, a third input terminal, a first output terminal and a second output terminal, wherein the read module is configured to read data from the memory module, wherein the first input terminal of the read module is coupled to the first terminal of the memory module, and wherein the second input terminal of the read module is coupled to the second terminal of the memory module, and wherein the third input terminal is configured to receive a read signal, and wherein the first output terminal of the read module is configured to provide a first read-out signal, and wherein the second output terminal of the read module is configured to provide a second read-out signal, and the read signal is an analog signal, and wherein the first read-out signal and the second read-out signal represent data stored in the memory module, and wherein the first read-out signal and the second read-out signal are logic complementary; and wherein
the memory module, the write module and the read module have a differential structure; and wherein
the memory module comprises a first Floating Gate Metal-Oxide Semiconductor transistor (FAMOS) and a second FAMOS, wherein the first FAMOS and the second FAMOS have a source, a drain and a floating gate respectively; and wherein the source of the first FAMOS and the source of the second FAMOS are connected together to receive a supply voltage; and wherein the drain of the first FAMOS is configured to operate as the first terminal of the memory module; and wherein the drain of the second FAMOS is configured to operate as the second terminal of the memory module.

18. A One-Time Programmable (OTP) memory cell, comprising:
a memory module having a first terminal and a second terminal, wherein the memory module is configured to store data;

a write module having a first input terminal, a second input terminal, a first output terminal and a second output terminal, wherein the write module is configured to write data in the memory module, and wherein the first input terminal of the write module is configured to receive a first write signal, and wherein the second input terminal of the write module is configured to receive a second write signal, and wherein the first output terminal of the write module is configured to provide a first write-in signal at the first terminal of the memory module, and wherein the second output terminal of the write module is configured to provide a second write-in signal at the second terminal of the memory module, and wherein the first write signal and the second write signal are logic complementary, and wherein the first write-in signal and the second write-in signal represent the data needed to store in the memory module, and wherein the first write-in signal and the second write-in signal are logic complementary;

a read module having a first input terminal, a second input terminal, a third input terminal, a first output terminal and a second output terminal, wherein the read module is configured to read data from the memory module, wherein the first input terminal of the read module is coupled to the first terminal of the memory module, and wherein the second input terminal of the read module is coupled to the second terminal of the memory module, and wherein the third input terminal is configured to receive a read signal, and wherein the first output terminal of the read module is configured to provide a first read-out signal, and wherein the second output terminal of the read module is configured to provide a second read-out signal, and the read signal is an analog signal, and wherein the first read-out signal and the second read-out signal represent data stored in the memory module, and wherein the first read-out signal and the second read-out signal are logic complementary; and wherein the memory module, the write module and the read module have a differential structure; and wherein the write module comprises a first N-type Metal-Oxide Semiconductor transistor (NMOS) and a second NMOS, wherein the first NMOS and the second NMOS have a source, a drain and a gate respectively; and wherein the source of the first NMOS and the source of the second NMOS are connected to a logic ground; and wherein the drain of the first NMOS is configured to operate as the first output terminal of the write module, and is coupled to the first terminal of the memory module; and wherein the drain of the second NMOS is configured to operate as the second output terminal of the write module, and is coupled to the second terminal of the memory module; and wherein the gate of the first NMOS is configured to operate as the first input terminal of the write module, and is configured to receive the first write signal; and wherein the gate of the second NMOS is configured to operate as the second input terminal of the write module, and is configured to receive the second write signal.

19. A One-Time Programmable (OTP) memory cell, comprising:

a memory module having a first terminal and a second terminal, wherein the memory module is configured to store data;

a write module having a first input terminal, a second input terminal, a first output terminal and a second output terminal, wherein the write module is configured to write data in the memory module, and wherein the first input terminal of the write module is configured to receive a first write signal, and wherein the second input terminal of the write module is configured to receive a second write signal, and wherein the first output terminal of the write module is configured to provide a first write-in signal at the first terminal of the memory module, and wherein the second output terminal of the write module is configured to provide a second write-in signal at the second terminal of the memory module, and wherein the first write signal and the second write signal are logic complementary, and wherein the first write-in signal and the second write-in signal represent the data needed to store in the memory module, and wherein the first write-in signal and the second write-in signal are logic complementary;

a read module having a first input terminal, a second input terminal, a third input terminal, a first output terminal and a second output terminal, wherein the read module is configured to read data from the memory module, wherein the first input terminal of the read module is coupled to the first terminal of the memory module, and wherein the second input terminal of the read module is coupled to the second terminal of the memory module, and wherein the third input terminal is configured to receive a read signal, and wherein the first output terminal of the read module is configured to provide a first read-out signal, and wherein the second output terminal of the read module is configured to provide a second read-out signal, and the read signal is an analog signal, and wherein the first read-out signal and the second read-out signal represent data stored in the memory module, and wherein the first read-out signal and the second read-out signal are logic complementary; and wherein the memory module, the write module and the read module have a differential structure; and wherein the read module comprises a first P-type Metal-Oxide Semiconductor transistor (PMOS) and a second PMOS, wherein the first PMOS and the second PMOS have a source, a drain and a gate respectively; and wherein the source of the first PMOS is configured to operate as the first input terminal of the read module, and is coupled to the first terminal of the memory module; and wherein the source of the second PMOS is configured to operate as the second input terminal of the read module, and is coupled to the second terminal of the memory module; and wherein the gate of the first PMOS and the gate of the second PMOS is connected together as the third input terminal of the read module to receive the read signal; and wherein the drain of the first PMOS is configured to operate as the first output terminal of the read module, and is configured to provide the first read-out signal; and wherein the drain of the second PMOS is configured to operate as the second output terminal of the read module, and is configured to provide the second read-out signal.

* * * * *